United States Patent [19]
McKernan et al.

[11] Patent Number: 5,284,539
[45] Date of Patent: Feb. 8, 1994

[54] METHOD OF MAKING SEGMENTED PYROLYTIC GRAPHITE SPUTTERING TARGETS

[75] Inventors: Mark A. McKernan, Livermore; Craig S. Alford, Tracy; Daniel M. Makowiecki; Chih-Wen Chen, both of Livermore, all of Calif.

[73] Assignee: Regents of the University of California, Oakland, Calif.

[21] Appl. No.: 42,668

[22] Filed: Apr. 5, 1993

[51] Int. Cl.⁵ .............................. B32B 31/00
[52] U.S. Cl. ...................... 156/154; 156/153; 156/269; 156/281; 156/272.6; 204/298.12; 204/298.13
[58] Field of Search .............. 156/153, 154, 73.1, 156/281, 269, 272.6, 272.2; 204/192.15, 298.12, 298.13

[56] References Cited

U.S. PATENT DOCUMENTS

| | | | |
|---|---|---|---|
| 4,382,113 | 5/1983 | Schwartz et al. | 156/153 X |
| 4,551,216 | 11/1985 | Argyo | 204/298.13 X |
| 4,913,762 | 4/1990 | Kittler | 204/192.15 X |

FOREIGN PATENT DOCUMENTS

| | | | |
|---|---|---|---|
| 52-24515 | 7/1977 | Japan | 204/298.12 |
| 63-35769 | 2/1988 | Japan | 204/298.12 |
| 63-210267 | 8/1988 | Japan | 204/192.15 |
| 63-210268 | 8/1988 | Japan | 204/192.15 |
| 63-230870 | 9/1988 | Japan | 204/298.12 |

*Primary Examiner*—Jeff H. Aftergut
*Attorney, Agent, or Firm*—Henry P. Sartorio; Danny C. Halverson

[57] ABSTRACT

Anisotropic pyrolytic graphite wafers are oriented and bonded together such that the graphite's high thermal conductivity planes are maximized along the back surface of the segmented pyrolytic graphite target to allow for optimum heat conduction away from the sputter target's sputtering surface and to allow for maximum energy transmission from the target's sputtering surface.

5 Claims, 1 Drawing Sheet

METHOD OF MAKING SEGMENTED PYROLYTIC GRAPHITE SPUTTERING TARGETS

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates generally to the fabrication of graphite sputtering targets and more specifically to the segmentation, orientation, and bonding of pyrolytic graphite sputter targets.

2. Description of Related Art

Sputter targets are used on a cathode sputtering apparatus to apply films or coatings of the target material on a substrate. Cathodic sputtering refers to the erosion of the cathode target material by ion bombardment that occurs when an electrical discharge is passed between electrodes in a low pressure gas. In the sputtering process inert gas ions with a positive charge are accelerated from the glow discharge, that forms between the electrodes, to the negative cathode. Erosion results from the ejection of atoms and clusters of atoms from the target surface as a result of momentum transfer from the bombarding ions. Sputtering becomes a coating process when the ejected material is deliberately condensed on a substrate suitably positioned near the cathode.

Magnetron sputtering is an effective method for producing carbon coatings from graphite targets. Magnetron sputtering uses a magnetic field to trap electrons in a region near the target surface creating a higher probability of ionizing a gas atom. The high density of ions created near the target surface causes material to be removed many times faster than in diode sputtering. The magnetron effect is created by an array of permanent magnets included within the cathode assembly that produce a magnetic field normal to the electric field.

Ion bombardment not only causes atoms of the target material to be ejected, but it also imparts considerable thermal energy to the target. Consequently, the target material must provide for adequate thermal transfer of the target's heat to the cooling media. This is particularly true in the case of magnetron sputtering where very large ion currents are produced causing a very intense and localized heating of the target.

Prior-art carbon sputter targets are typically made from plates of high-purity hot-pressed graphite. Although this material is high in chemical purity, it generally possesses about 15% porosity, which also introduces defects into the carbon films it produces. A more attractive material for carbon sputter targets is high-purity fully-dense pyrolytic graphite. However, the anisotropic heat transfer properties of pyrolytic graphite have prevented its use in the past as a carbon sputter target material. In the present invention a segmented sputter target design, with directionally oriented pyrolytic graphite pieces that are bonded together, engineers around the heat transfer problem to allow the use of pyrolytic graphite as a target material.

Carbon films deposited by magnetron sputtering are used in a variety of commercial and scientific applications. The quality of the carbon film can be adversely affected by the growth of carbon whiskers on the carbon target during the sputtering process. An observed correlation exists between the number of defects in the carbon film and the amount of whisker growth in the erosion area of the sputter target. The effect of sputtering process parameters on whisker growth has been studied and was published by Chen, et al. in "Surface-Defect Formation in Graphite Targets During Magnetron Sputtering (J. Vac. Sci. Technol. A8(4), Jul./Aug. 1990). Whisker growth in a carbon target results in defects in the sputtered carbon film produced. Selection of an appropriate target design and the type of carbon in the sputter target can significantly reduce the amount of whisker growth during magnetron sputtering.

Since sputtering is a momentum transfer process where atoms of a target are ejected by striking the target surface with ions, most of the energy in the sputtering process converts to heat in the sputter target. This heat is removed by directly or indirectly cooling the sputter target. The anisotropic thermal conductivity of pyrolytic graphite makes efficient cooling by such means difficult. The limitations in the prior-art synthesis of pyrolytic graphite targets produces a target material with the low thermal conductivity c-axis normal to the target's surface. Because the high thermal conductivity a-axis and b-axis of the target material are parallel to the target's surface, heat is conducted along the target faster than it is conducted away from the target. The result is target overheating that causes inefficient sputtering of the pyrolytic graphite.

U.S. Pat. No. 4,136,213 teaches the vapor deposition of electrically conductive carbon onto oxide supports to produce electrodes. U.S. Pat. No. 4,551,216 describes a sputtering process for producing carbon films on a substrate where the coating layer is thin and possesses low conductivity. U.S. Pat. No. 4,767,517 shows a sputtering process for producing diamond-like thin film coatings. Japanese Patent 24515 teaches the fabrication of dielectric targets for sputtering comprised of a number small blocks assembled together and bonded to an electrode. There is no mention of producing or using pyrolytic graphite layers in any of these inventions.

SUMMARY OF THE INVENTION

The present invention compensates for the thermal conductivity problems associated with prior graphite targets by transferring heat via directionally oriented pyrolytic graphite segments that have been bonded together and machined to a desired target configuration.

Accordingly, it is an object of this invention to provide a method for forming segmented pyrolytic graphite sputter targets in which the graphite is situated in such a way that thermal energy is directed along optimal planes for maximum thermal conduction of heat away from the target.

Another object of this invention is to provide for segmented pyrolytic graphite sputter targets with the planes of maximum thermal conduction serving as the target surface such that maximum energy is transmitted from the sputtering surface.

Briefly, the invention comprises segmenting a monolithic piece of pyrolytic graphite into wafers where the high thermal conductive axes define planes parallel to the planes of segmentation and bonding. The segmented wafers are then bonded together with an organic cement and the bonded assembly is then machined to the desired target configuration.

BRIEF DESCRIPTION OF THE DRAWINGS

The various novel features of this invention, along with the foregoing and other objects as well as the invention itself both as to its organization and method of operation, may be more fully understood from the following description of the illustrated embodiments when read in conjunction with the accompanying drawings wherein.

DETAILED DESCRIPTION OF THE INVENTION

Figure 1:
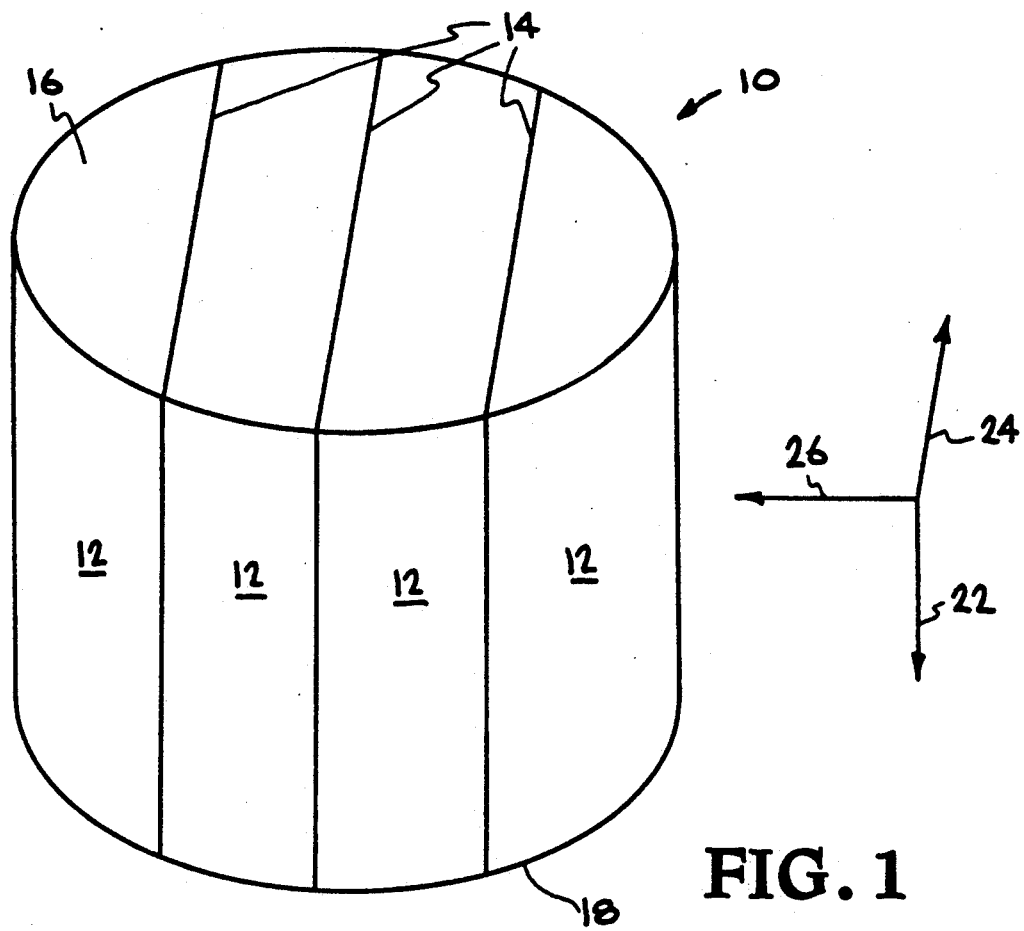
FIG. 1 is a schematic cross-section view of a finished segmented pyrolytic graphite sputtering target fabricated in accordance with the present invention.

Referring to FIG. 1, there is shown a segmented pyrolytic graphite sputtering target 10 with pyrolytic graphite wafers 12 positioned such that the edges of a large number of high thermal conductivity planes, defined by axes 22 and 24, are in contact with the cathode (not shown) at the base 18 of the sputtering target 10. Organic cement bonds 14 hold the wafers 12 together. The preferred materials for the organic cement bonds is C-34 with C-7. The sputtering surface 16 likewise possesses a large number of high thermal conductivity planes which enhances the energy transmitted from the sputtering surface 16 during ion bombardment.

Figure 2:
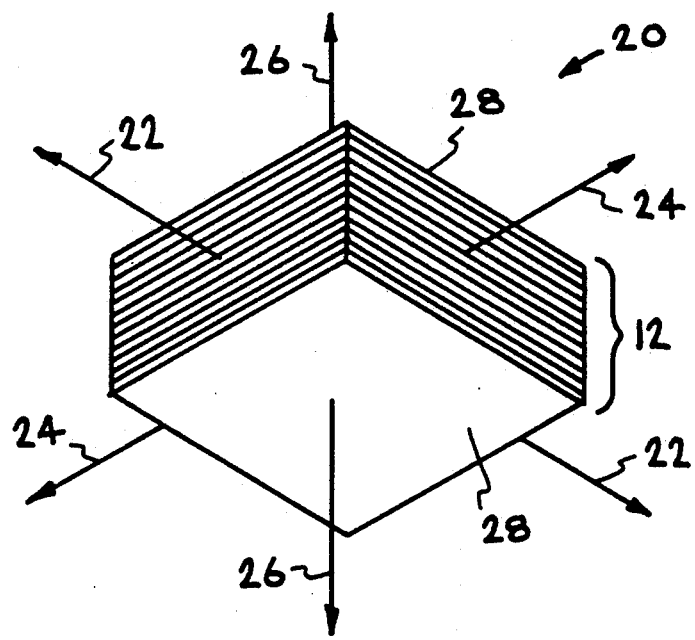
FIG. 2 is a perspective schematic representation of the anisotropy associated with pyrolytic graphite materials showing high thermal conductivity and low thermal conductivity directions.

Referring now additionally to FIG. 2, the anisotropic structure 20 of one pyrolytic graphite wafer 12 is illustrated showing several parallel high thermal conductivity planes defined by the high thermal conductivity axes 22 and 24, and also showing the low thermal conductivity axis 26 perpendicular to these high thermal conductivity planes.

Prior to cementing, the to-be-bonded pyrolytic graphite surfaces 28 are machined flat and ultrasonically washed in a series of successive ethy alcohol baths until all machining debris is removed from the to-be-bonded surfaces 28. The pyrolytic graphite wafers 12 are then heated on a hot plate to drive off any absorbed alcohol remaining after the cleaning process.

Next, the to-be-bonded surfaces 28 are covered with organic cement and clamped together to form multiple bonds 14 between several graphite wafers 12. The bonded assembly, when dry, is then machined to the final target geometry.

The present invention is superior over other graphite sputtering targets where the thermal anisotropy and porosity of graphite are a problem. Such inferior designs have severe overheating problems due to the structural anisotropy of graphite. The segmented pyrolytic graphite sputter target functions without overheating because the heat is transferred away from the sputtering surface 16 along the conducting graphite planes defined by axes 22 and 24. Furthermore, thermally conductive paste is often used between the graphite target and the cathode to enhance sputter target cooling. When used in conjunction with porous graphite targets, wicking to the sputtering surface often occurs, contaminating the material to be deposited. By using fully dense pyrolytic graphite, wicking and contamination problems are avoided.

While this invention has been described with reference to several preferred embodiments, it is contemplated that various alterations and modifications thereof will become apparent to those skilled in the art upon a reading of the preceding detailed description. It is therefore intended that the following appended claims be interpreted as including all such alterations and modifications as fall within the true spirit and scope of this invention.

We claim:

1. A method of fabricating segmented pyrolytic graphite sputtering targets comprising the steps of:
   providing at least two pyrolytic graphite wafer segments having a sputtering surface, an opposed back surface, and at least one bonding surface, wherein the number of edges of high thermal conductivity planes in the graphite is maximized along said back surface of the wafer segments;
   attaching said pyrolytic graphite wafer segments together along said bonding surfaces to form a segmented pyrolytic graphite sputtering target;
   machining said segmented pyrolytic graphite sputter target to a desired geometry.

2. The method of claim 1, wherein the step of attaching the wafer segments comprises:
   preparing said bonding surfaces to receive an organic cement by machining the bonding surfaces flat and cleaning the machined surfaces to remove residual particles from the machining process;
   applying said cement to said bonding surfaces and holding the cemented surfaces together until the cement is dry.

3. The method of claim 2, wherein said cleaning step further comprises ultrasonically washing said machined surfaces with a solvent and then drying said machined surfaces.

4. The method of claim 3, wherein said solvent is ethyl alcohol, said washing step is performed in successive ultrasonic baths of said solvent, and said drying step is performed by heating the washed wafers on a hot plate to drive off any residual absorbed solvent from the washing step.

5. The method of claim 1, wherein the wafer segments are formed having the bonding surfaces substantially perpendicular to said sputtering and back surfaces, and wherein high thermal conductivity planes of the graphite are substantially parallel to the bonding surface.

* * * * *